(12) United States Patent
Hachiya et al.

(10) Patent No.: US 11,217,610 B2
(45) Date of Patent: Jan. 4, 2022

(54) METHOD OF MANUFACTURING ACTIVE MATRIX SUBSTRATE

(71) Applicant: SHARP KABUSHIKI KAISHA, Sakai (JP)

(72) Inventors: Atsushi Hachiya, Sakai (JP); Hiroaki Furukawa, Sakai (JP); Kazuya Tsujino, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/833,286

(22) Filed: Mar. 27, 2020

(65) Prior Publication Data

US 2020/0312889 A1 Oct. 1, 2020

Related U.S. Application Data

(60) Provisional application No. 62/826,470, filed on Mar. 29, 2019.

(51) Int. Cl.
*H01L 27/12* (2006.01)
*H01L 29/786* (2006.01)
*G02B 26/00* (2006.01)

(52) U.S. Cl.
CPC ........ *H01L 27/1244* (2013.01); *G02B 26/005* (2013.01); *H01L 27/1225* (2013.01); *H01L 27/1248* (2013.01); *H01L 27/1259* (2013.01); *H01L 29/7869* (2013.01)

(58) Field of Classification Search
CPC ............. H01L 27/1244; H01L 27/1225; H01L 27/1248; H01L 27/1259; H01L 29/7869; H01L 29/66795; H01L 29/40111; H01L 29/66477; G02B 26/005; G02B 26/0004; G02B 26/02; G02B 26/00
See application file for complete search history.

(56) References Cited

U.S. PATENT DOCUMENTS

| 8,194,304 B2 * | 6/2012 | Niwano | G02B 26/004 359/296 |
| 9,244,267 B2 * | 1/2016 | Lim | G02B 26/005 |
| 10,133,057 B1 * | 11/2018 | Petcu | G02B 26/005 |

(Continued)

FOREIGN PATENT DOCUMENTS

| JP | 2014-074864 A | 4/2014 |
| WO | 2008/084822 A1 | 7/2008 |

OTHER PUBLICATIONS

AFA-1-¬ 13A, https://www.chukoh.com/products/tape/afa-113a (Year: 2018).*

(Continued)

*Primary Examiner* — Nikolay K Yushin
(74) *Attorney, Agent, or Firm* — ScienBiziP, P.C.

(57) ABSTRACT

An active matrix substrate includes: a first substrate; and first electrodes, a dielectric layer covering the first electrodes, and a first water-repelling layer in this sequence on the first substrate, wherein the dielectric layer has a multilayer structure including two or more layers and includes a silicon nitride film and a metal-oxide film between the silicon nitride film and the first water-repelling layer, and the silicon nitride film has an oxygen-containing surface layer region on a surface thereof that is in contact with the metal-oxide film.

2 Claims, 9 Drawing Sheets

(56) References Cited

U.S. PATENT DOCUMENTS

| | | | |
|---|---|---|---|
| 2009/0059348 A1* | 3/2009 | Niwano | G02B 26/004 359/296 |
| 2010/0053717 A1 | 3/2010 | Takahashi | |
| 2013/0301108 A1* | 11/2013 | Lim | G02B 26/005 359/290 |

OTHER PUBLICATIONS

C. V. Ramana et al., "Growth Behavior, Lattice Expansion, Strain, and Surface Morphology of Nanocrystalline, Monoclinic HfO2 Thin Films", The Journal of Physical Chemistry C, 116(18), pp. 9955-9960 (2012).

Yutaka Nishi et al., "Characteristics of Plasma-Enhanced-Chemical-Vapor-Deposition Tetraethylorthosilicate Oxide and Thin-Film-Transistor Application", Japanese Journal of Applied Physics, vol. 31, pp. 4570-4573 (1992).

* cited by examiner

METHOD OF MANUFACTURING ACTIVE MATRIX SUBSTRATE

CROSS-REFERENCE TO RELATED APPLICATION

The present application claims priority from Provisional Application No. 62/826,470, the content to which is hereby incorporated by reference into this application.

BACKGROUND OF THE INVENTION

1. Field of the Invention

The present invention relates to active matrix substrates, microfluidic devices including an active matrix substrate, and methods of manufacturing active matrix substrates and microfluidic devices.

2. Description of the Related Art

Microfluidics and related technology requires manipulation and precise control of a tiny amount of fluid (ex., in submicroliters). Electrowetting (EW), capable of manipulating droplets by applying an electric field, is accordingly receiving increasing attention to fill these needs.

Electrowetting is a phenomenon where under an applied voltage, a droplet placed on a water-repelling layer that is in turn on a dielectric layer covering an electrode changes its contact angle to the surface of the water-repelling layer, due to a change in the surface energy of the dielectric layer that is equal to the electrostatic energy of the capacitor formed between the electrode and the droplet and an accompanying change in the solid-liquid interface energy.

Microfluidic devices (also referred to as "electrowetting devices" or "droplet devices") have been developed that exploit electrowetting.

In a thin-film transistor (TFT)-controlled, active matrix electrowetting-on-dielectric (AM-EWOD) device as an example of microfluidic devices, an active matrix substrate including a water-repelling layer and an opposite substrate also including a water-repelling layer are separated by a gap and attached together via a sealing member in such a manner that the water-repelling layers are located opposite each other. Droplets are contained in the gap. The thin-film electronic circuitry (active elements) included TFTs on the active matrix substrate is configured to selectively apply an actuation voltage to the electrodes.

PCT International Application Publication No. WO2008/084822, as an example, describes a liquid device, which is an example of the microfluidic device, applicable to, for example, an image display device.

In this liquid device, an insulating film is provided between the electrodes and the water-repelling layer to enhance dielectric strength. The insulating film is formed by calcining a silica-based inorganic coating film (e.g., SOG (spin-on-glass)) for vitrification.

Japanese Unexamined Patent Application Publication, Tokukai, No. 2014-74864 describes an optical element that exploits the electrowetting phenomenon.

The optical element includes an insulating film on electrodes to actuate a droplet with a lower applied voltage. The insulating film includes a dielectric layer containing a metal oxide and a water-repelling layer containing a cyclic olefin polymer.

The dielectric layer containing a metal oxide, that is, a metal-oxide film, is described as being formed, for example, by physical vapor deposition (PVD) in C. V. Ramana et al., "Growth Behavior, Lattice Expansion, Strain, and Surface Morphology of Nanocrystalline, Monoclinic HfO2 Thin Films," Journal of Physical Chemistry C, 116(18), pp. 9955-9960 (2012). The dielectric layer containing a metal oxide is also described as being formed, for example, by chemical vapor deposition (CVD) in Yutaka Nishi et al., "Characteristics of Plasma-Enhanced-Chemical-Vapor-Deposition Tetraethylorthosilicate Oxide and Thin-Film-Transistor Application," Japanese Journal of Applied Physics, Vol. 31, pp. 4570-4573 (1992).

SUMMARY OF THE INVENTION

To use an SOG-based insulating film in an AM-EWOD device including TFTs, however, the calcination step where SOG is vitrified at about 300° C. can negatively affect the characteristics of the TFTs. If, for example, the interlayer insulating layer in the TFT contains an organic material such as an acrylic resin, this high-temperature process can degrade the organic material.

These issues may be addressed by using, in place of a SOG-based insulating film, a dielectric layer composed of a silicon nitride (SiNx) film formed by plasma chemical vapor deposition (plasma CVD). The silicon nitride film formed by plasma CVD exhibits a high permittivity and do not influence the characteristics of the TFTs, thereby lowering actuation voltages in electrowetting.

The silicon nitride film can however fail in some cases to deliver sufficient adhesion on the fluorine resin contained in the water-repelling layer, which would lead to the peeling of layers during manufacture and also to insufficient water-repelling properties and leak resistance.

Meanwhile, a silicon oxide (SiOx) film, if used in place of the silicon nitride film as a dielectric layer, improves adhesion on the fluorine resin, but leads to a low permittivity, thereby undesirably requiring an increased electrowetting actuation voltage.

An aspect of the present invention has been made in view of these issues and has an object to provide an active matrix substrate that can be actuated with a lower voltage and that can achieve excellent adhesion between a dielectric layer and a water-repelling layer and a microfluidic device, including such an active matrix substrate, that can achieve consistent actuation of a droplet.

The present specification discloses the electrowetting devices described in the items below.

[Item 1]

An active matrix substrate including: a first substrate; and first electrodes, a dielectric layer covering the first electrodes, and a first water-repelling layer in this sequence on the first substrate, wherein the dielectric layer has a multilayer structure including two or more layers and includes a silicon nitride film and a metal-oxide film between the silicon nitride film and the first water-repelling layer, and the silicon nitride film has an oxygen-containing surface layer region on a surface thereof that is in contact with the metal-oxide film.

[Item 2]

The active matrix substrate described in item 1, wherein the metal-oxide film is a hafnium oxide film.

[Item 3]

The active matrix substrate described in item 1 or 2, wherein the first water-repelling layer contains a fluorine resin that has functional groups for adhesion to the metal-oxide film.

[Item 4]

A microfluidic device including: the active matrix substrate described in any one of items 1 to 3; and an opposite substrate including: a second substrate; and a second electrode and a second water-repelling layer in this sequence on the second substrate, wherein the active matrix substrate and the opposite substrate are attached together via a sealing member with a gap intervening therebetween in such a manner that the first water-repelling layer and the second water-repelling layer are located opposite each other.

[Item 5]

A method of manufacturing an active matrix substrate, the method including: forming first electrodes on a first substrate; forming a dielectric layer covering the first electrodes; and forming a first water-repelling layer on the dielectric layer, wherein the forming of the dielectric layer includes: forming a silicon nitride film by plasma chemical vapor deposition; oxidizing a surface of the silicon nitride film; and forming a metal-oxide film by atomic layer deposition, and the forming of the first water-repelling layer includes forming the first water-repelling layer on a surface of the metal-oxide film.

[Item 6]

A method of manufacturing a microfluidic device, the method including: the method described in item 5; forming an opposite substrate, the forming of the opposite substrate including forming a second electrode on a second substrate and forming a second water-repelling layer on the second electrode; and attaching the active matrix substrate and the opposite substrate together via a sealing member with a gap intervening therebetween in such a manner that the first water-repelling layer and the second water-repelling layer are located opposite each other.

BRIEF DESCRIPTION OF DRAWINGS

Portion (a) of FIG. 1 is a schematic illustration of bonding of an oxidized silicon nitride film surface, a metal-oxide film, and a water-repelling layer surface. Portion (b) of FIG. 1 is a schematic illustration of the condition of a non-oxidized silicon nitride film surface and a water-repelling layer surface.

Portion (a) of FIG. 2 is a schematic cross-sectional view of an active matrix substrate in accordance with Embodiment 1 of the present invention. Portion (b) of FIG. 2 is a schematic cross-sectional view of an active matrix substrate including no metal-oxide film.

Figure 3:
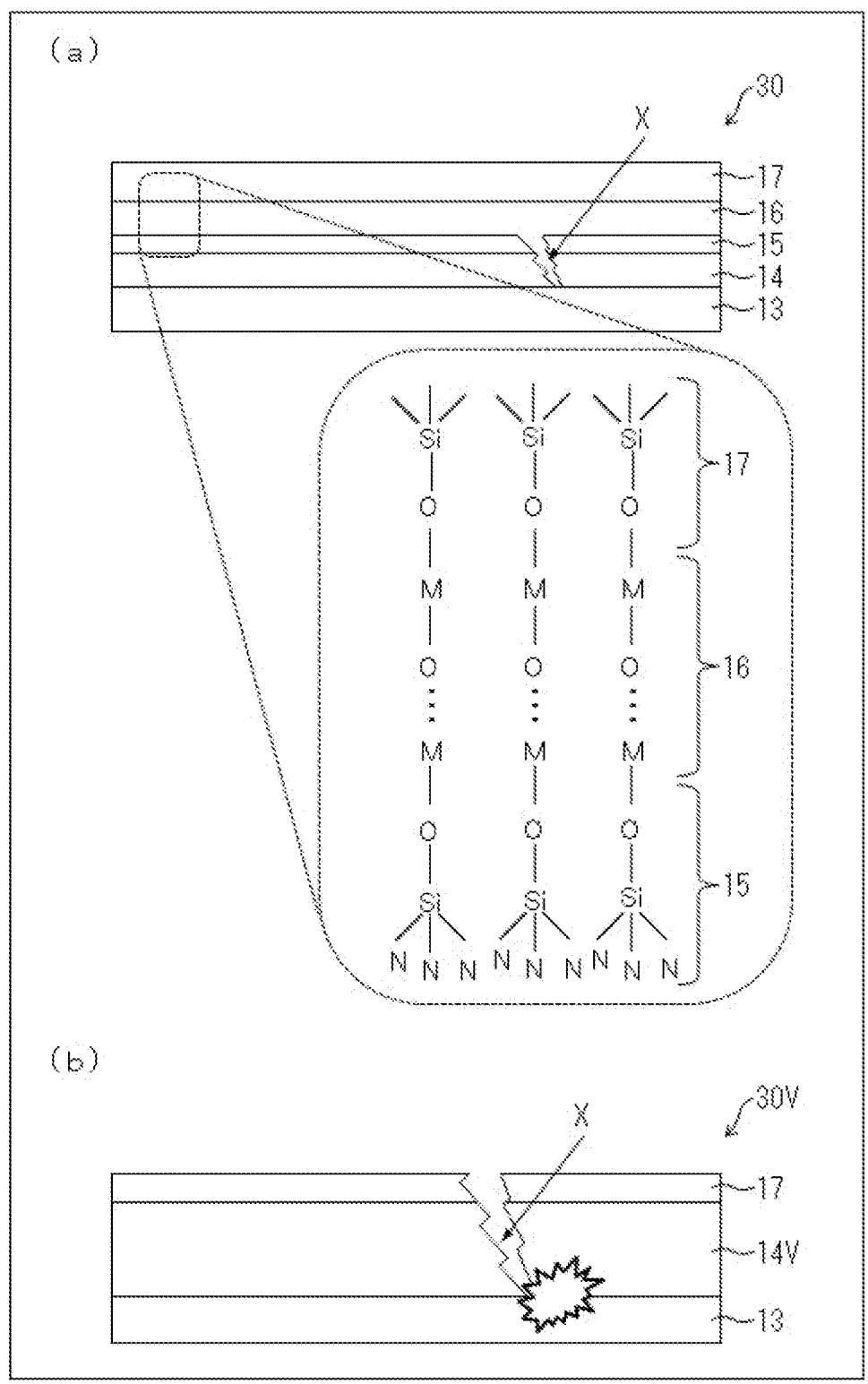

Portion (a) of FIG. 3 is a schematic cross-sectional view of the active matrix substrate in accordance with Embodiment 1 of the present invention in which a leak source has been generated. Portion (b) of FIG. 3 is a schematic cross-sectional view of an active matrix substrate including no metal-oxide film in which a leak source has been generated.

Figure 4:
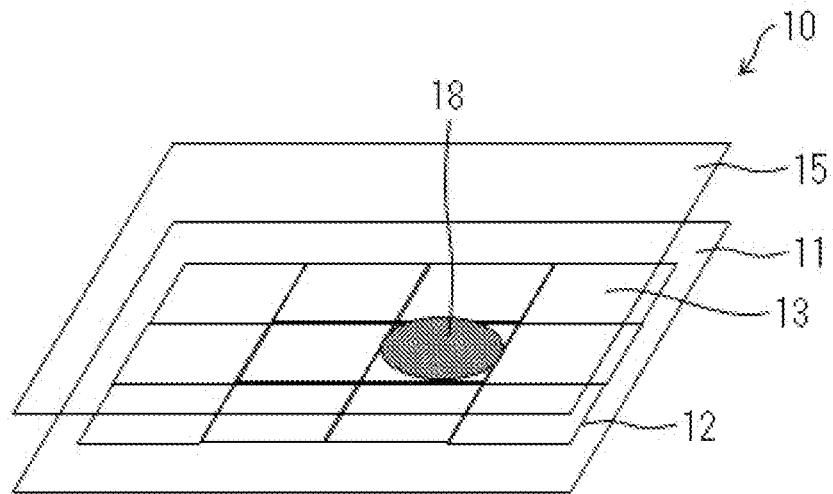

FIG. 4 is an illustration of an AM-EWOD device in accordance with Embodiment 1 of the present invention.

Figure 5:
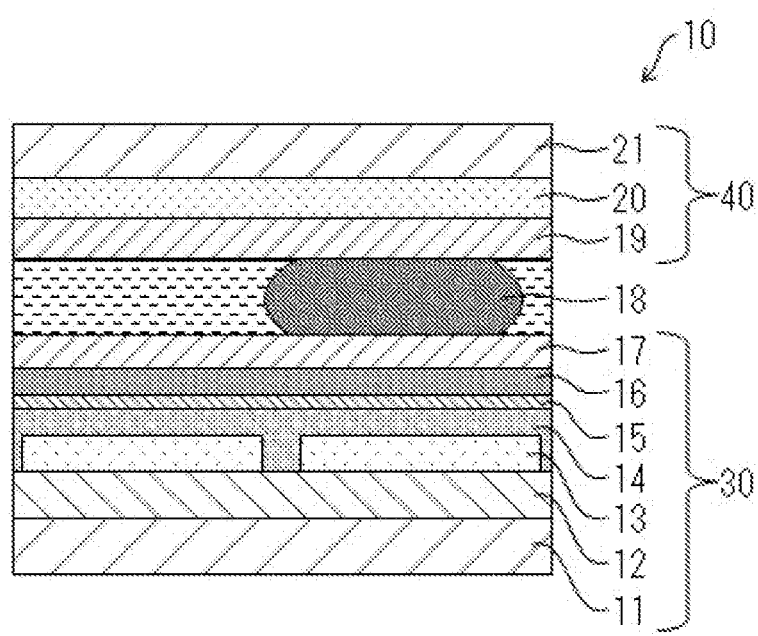

FIG. 5 is a cross-sectional view of the AM-EWOD device in accordance with Embodiment 1 of the present invention.

Figure 6:
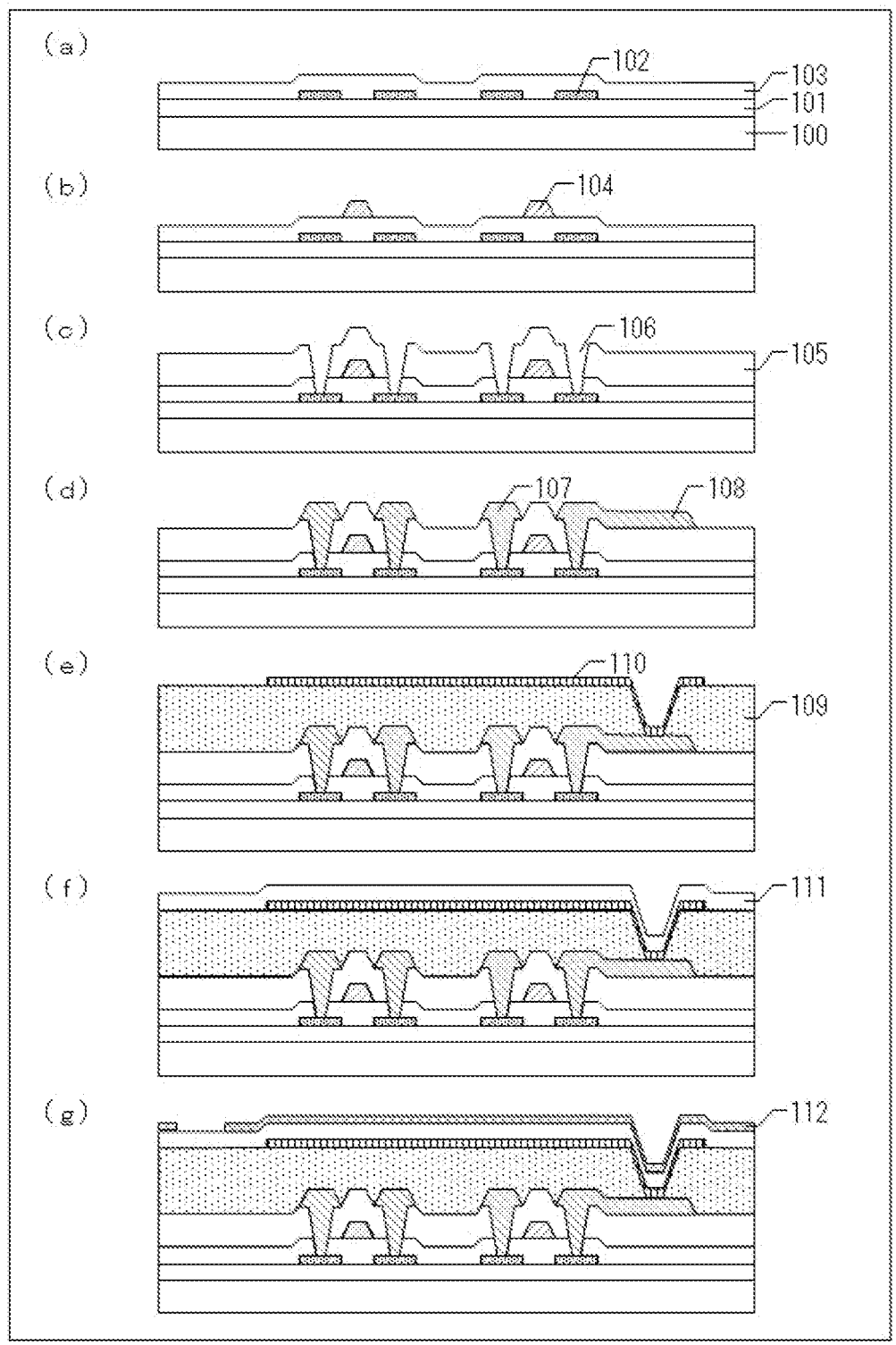

FIG. 6 is an illustration of a method of manufacturing an active matrix substrate in accordance with Embodiment 2 of the present invention.

Figure 7:
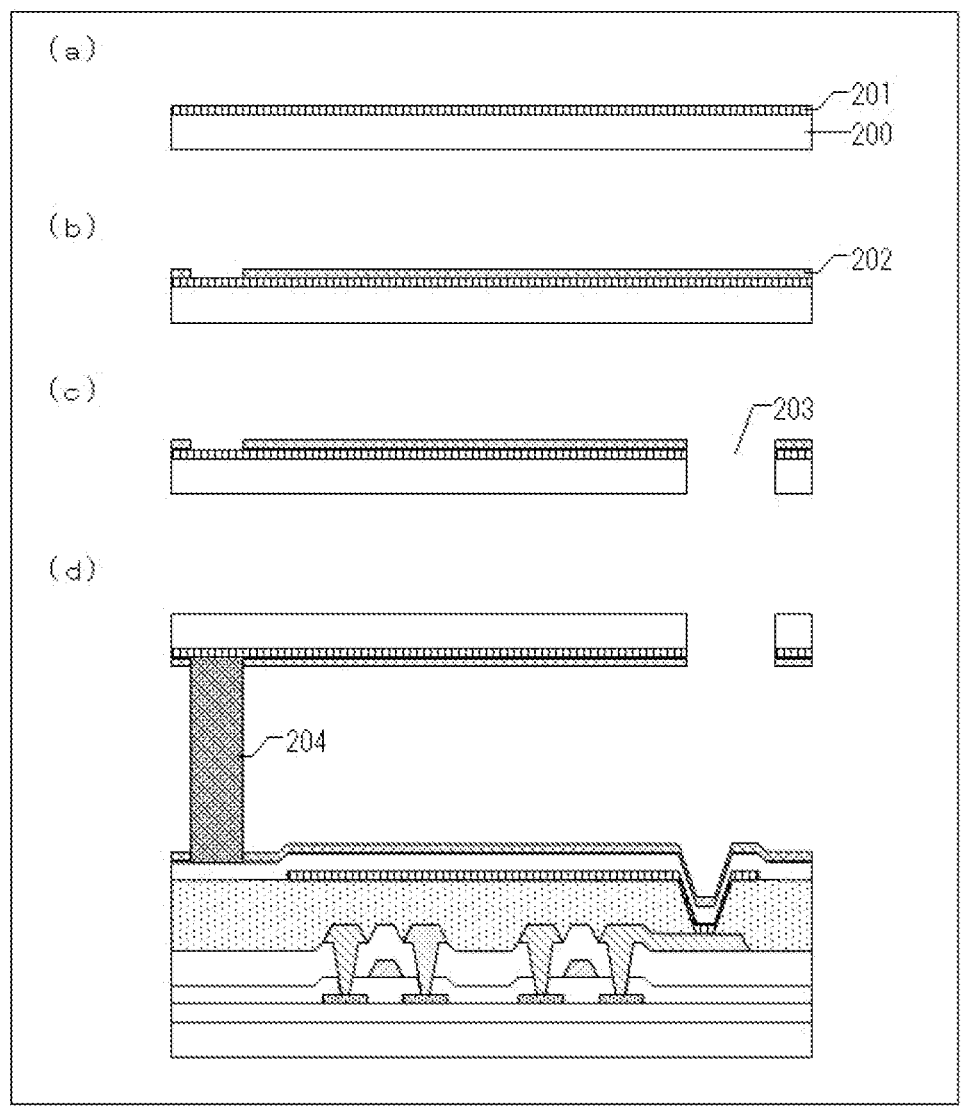

FIG. 7 is an illustration of a method of manufacturing an opposite substrate in accordance with Embodiment 2 of the present invention.

Figure 8:
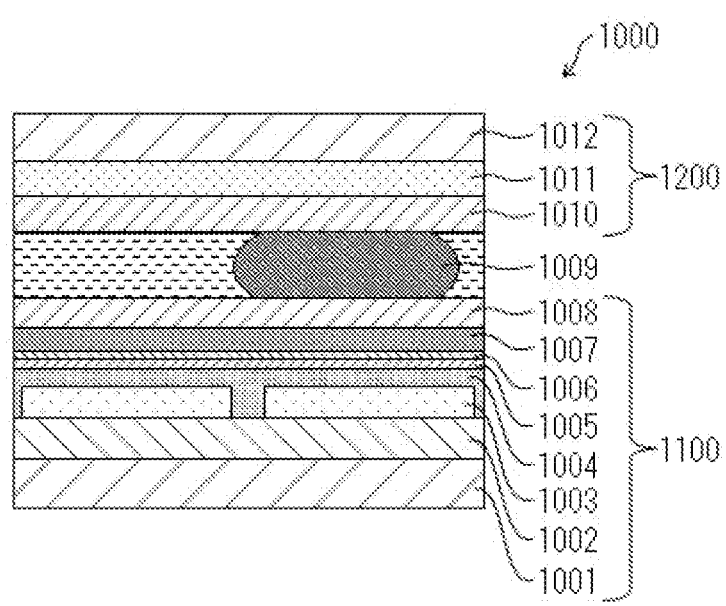

FIG. 8 is a cross-sectional view of an AM-EWOD device in accordance with Embodiment 4 of the present invention.

Figure 9:
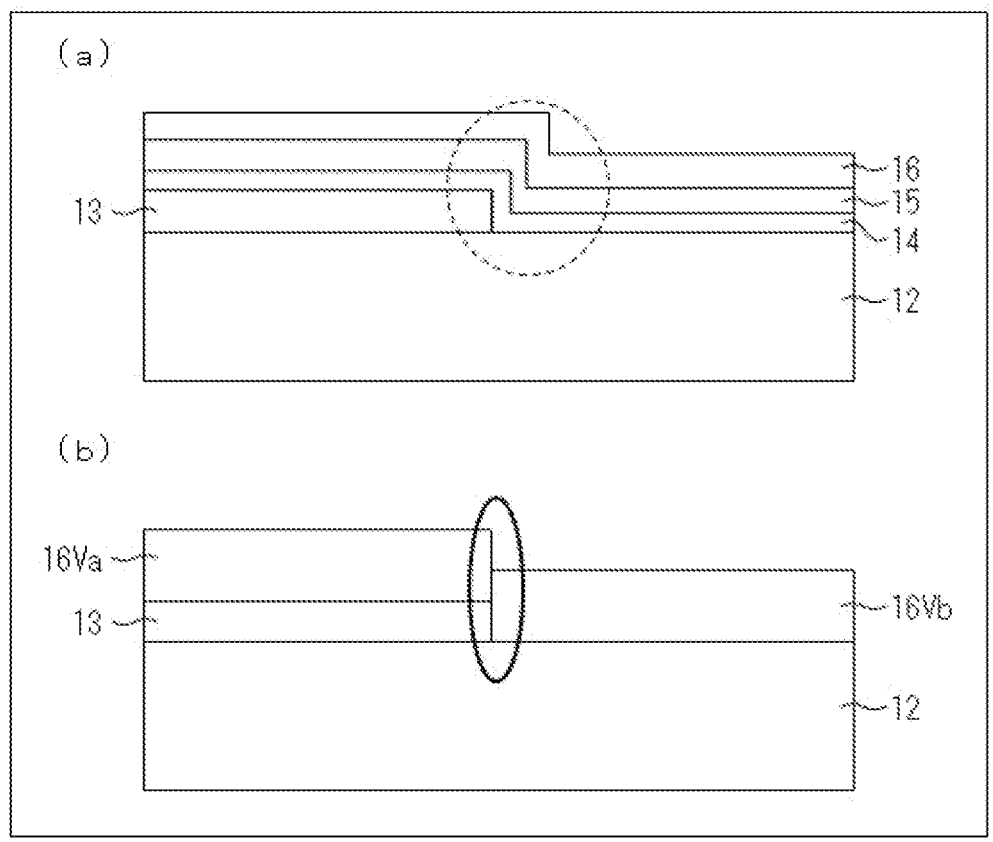

Portion (a) of FIG. 9 is a schematic cross-sectional view of an end region of an array electrode of the active matrix substrate in accordance with Embodiment 1 of the present invention. Portion (b) of FIG. 9 is a schematic cross-sectional view of an end region of an array electrode with a metal-oxide film being directly stacked on the array electrode.

DETAILED DESCRIPTION OF THE INVENTION

The following will describe an embodiment of the present invention in detail.

Embodiment 1

The present embodiment will describe, as an example of a microfluidic device in accordance with the present invention, an active matrix electrowetting-on-dielectric (AM-EWOD) device that uses thin film transistors (TFTs) to actuate a droplet (electrowetting-on-dielectric) in an active matrix array.

A description is now given of an embodiment of the present invention with reference to FIGS. 1 to 5.

Figure 1:
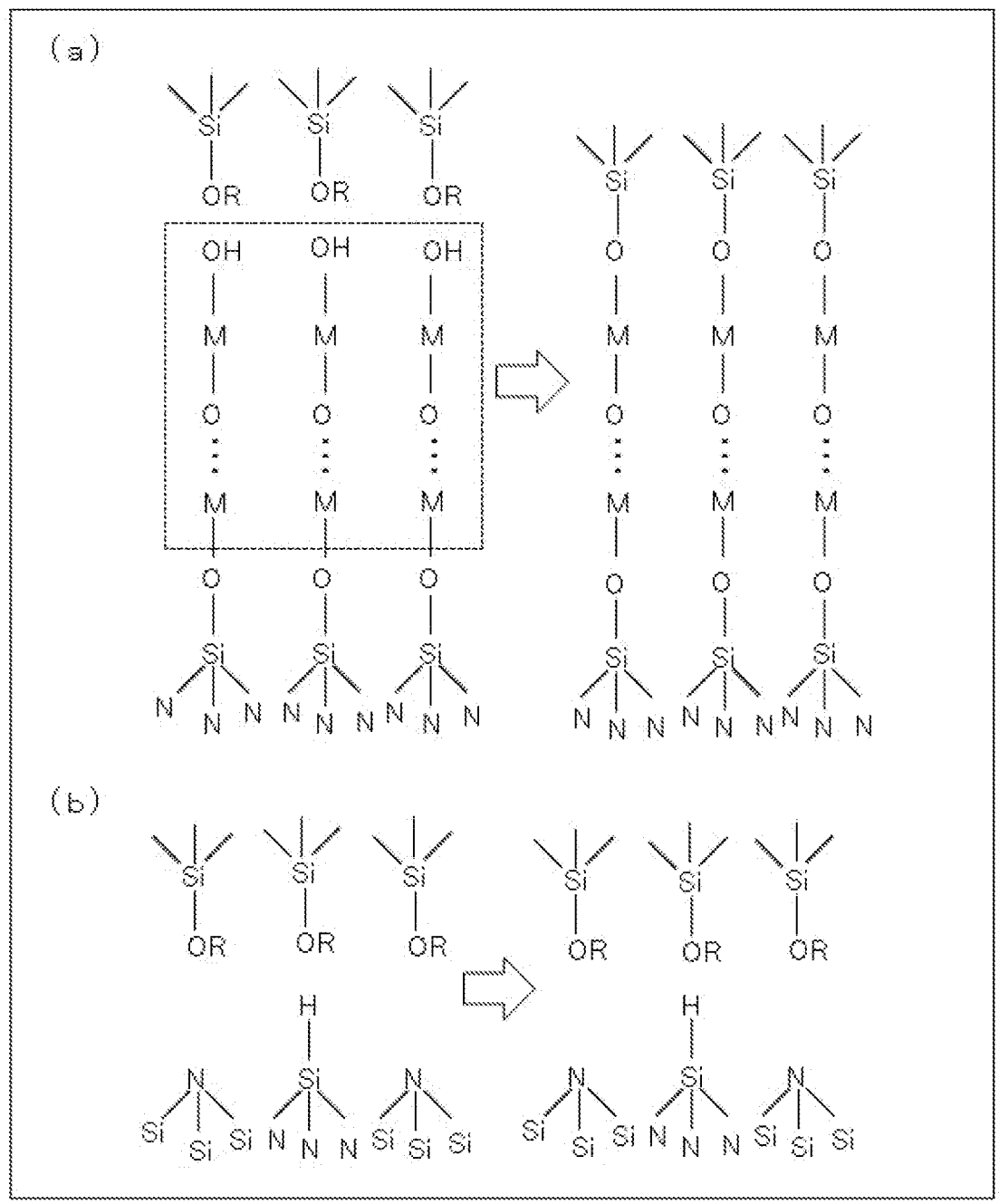

Portion (a) of FIG. 1 is a schematic illustration of bonding of an oxidized silicon nitride film surface, a metal-oxide film, and a water-repelling layer surface. Portion (b) of FIG. 1 is a schematic illustration of the condition of a silicon nitride film surface and a water-repelling layer surface in a conventional active matrix substrate.

Figure 2:
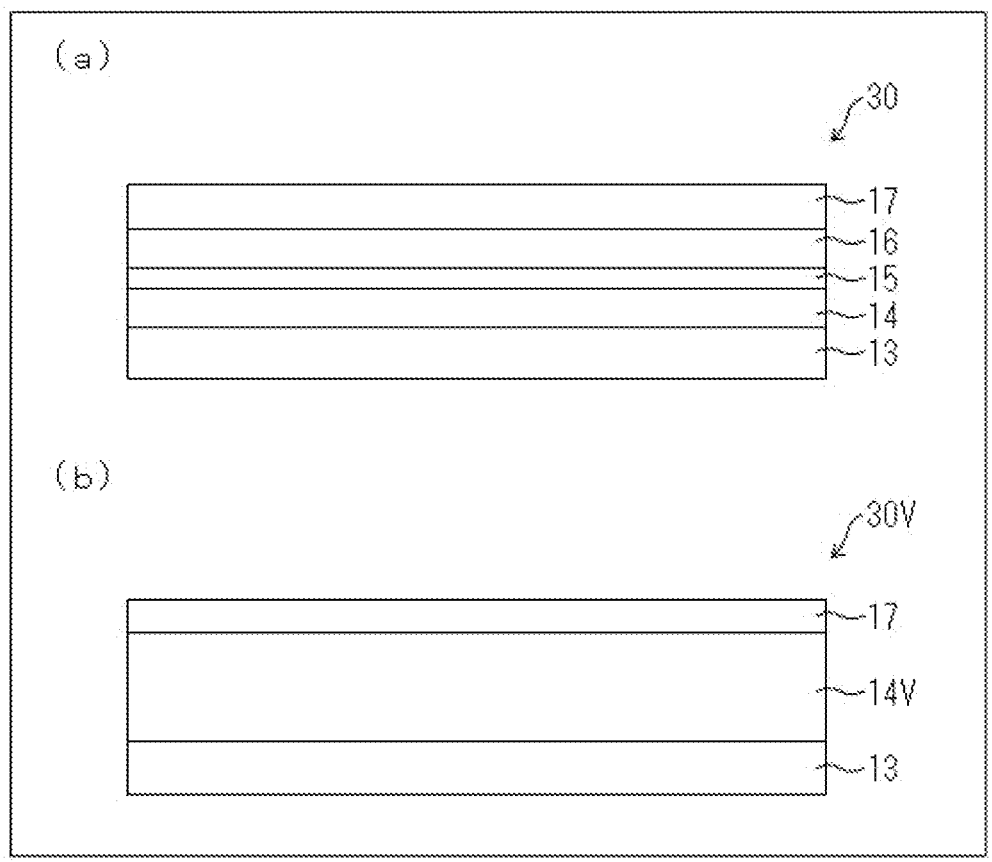

Portion (a) of FIG. 2 is a schematic cross-sectional view of an active matrix substrate in accordance with Embodiment 1 of the present invention. Portion (b) of FIG. 2 is a schematic cross-sectional view of a conventional active matrix substrate including no metal-oxide film.

Portion (a) of FIG. 3 is a schematic cross-sectional view of the active matrix substrate in accordance with Embodiment 1 of the present invention in which a leak source has been generated. Portion (b) of FIG. 3 is a schematic cross-sectional view of an active matrix substrate including no metal-oxide film in which a leak source has been generated.

FIG. 4 is an illustration of an AM-EWOD device in accordance with Embodiment 1 of the present invention.

FIG. 5 is a cross-sectional view of the AM-EWOD device in accordance with Embodiment 1 of the present invention.

Referring to FIGS. 4 and 5, an AM-EWOD device 10 in accordance with the present embodiment includes an active matrix substrate 30 including a first substrate 11, an opposite substrate 40 including a second substrate 21, and at least one droplet 18 enclosed in a gap between the substrates 30 and 40.

The active matrix substrate 30 includes a thin-film electronic circuit 12 on the first substrate 11 and a plurality of actuatable array electrodes (first electrodes) 13 on the thin-film electronic circuit 12. The first substrate 11 is, for example, a glass substrate. The thin-film electronic circuit 12 includes, for example, thin film transistors. The thin-film electronic circuit 12 is so configured as to selectively apply suitable actuation voltages to the array electrodes (first electrodes) 13 on the basis of control signals from an external actuation circuit (not shown). The EWOD-actuated droplet 18 is confined between the active matrix substrate 30 and the opposite substrate 40. The present embodiment may involve either a single droplet 18 or a plurality of droplets 18.

Referring to FIG. 5, the AM-EWOD device 10 in accordance with the present embodiment includes a dielectric layer on the thin-film electronic circuit 12 and the array electrodes (first electrodes) 13 both on the first substrate 11, so as to cover the thin-film electronic circuit 12 and the array electrodes 13. The dielectric layer may be composed of, for example, silicon nitride, silicon oxide, or metal oxide. The dielectric layer preferably includes a metal oxide among these examples because a metal oxide can deliver a larger electrostatic capacitance than silicon nitride or silicon oxide of the same thickness.

The dielectric layer, in the present embodiment, includes a silicon nitride film 14, a surface layer region 15 thereof, and a metal-oxide film 16. The silicon nitride film 14 is disposed as an underlayer on a side that is in contact with the first electrodes. The metal-oxide film 16 is disposed as a surface layer on a side that is in contact with a first water-repelling layer. In this device, the silicon nitride film 14 has, on a side thereof that is in contact with the metal-oxide film, a surface that is oxidized and that thereby provides the surface layer region 15 where the silicon nitride film, containing nitrogen (N), silicon (Si), and hydrogen (H) among others, is doped with oxygen (O) in the surface and its vicinity. The metal-oxide film 16 is disposed on this oxygen-containing surface layer region 15.

The first water-repelling layer 17 is disposed on the metal-oxide film 16. The water-repelling property of the water-repelling layer changes with the voltage applied to the array electrode (first electrode) 13 and controlled to facilitate movement of the droplet 18.

The array electrodes (first electrodes) 13 are transparent oxide electrodes of, for example, ITO (indium tin oxide), IZO (indium zinc oxide), or ZnO (zinc oxide) or metal electrodes of, for example, titanium (Ti) or aluminum (Al) and are arranged in a distributed manner in accordance with the pattern of the thin-film electronic circuit 12.

The silicon nitride film and the metal-oxide film in the dielectric layer are disposed in order to protect the thin-film electronic circuit 12 and the array electrodes (first electrodes) 13 and to ensure that the thin-film electronic circuit 12 and the array electrodes (first electrodes) 13 are insulated from the droplet 18.

The silicon nitride film serving as an underlayer is suitably formed by plasma CVD using a source gas containing, for example, a nitrogen-containing gas (e.g., gaseous $N_2$ or gaseous $NH_3$) and gaseous $SiH_4$. In other words, a fine, high-permittivity dielectric layer can be formed by growing a silicon nitride film by chemical vapor deposition in a plasma CVD device while feeding the source gas.

The provision of the silicon nitride film as an underlayer enables the metal-oxide film to be formed with uniform film quality on the silicon nitride film. In other words, the uniform covering of the thin-film electronic circuit 12 and the array electrodes 13 with a silicon nitride film can restrain changes in the quality of the metal-oxide film that are likely to occur at the interface between the thin-film electronic circuit 12 and the array electrodes 13, thereby enabling formation of a uniform metal-oxide film.

The composition of silicon nitride (SiNx) may be selected in a suitable manner by a person skilled in the art in accordance with desirable insulation and permittivity through the adjustment of the flow rate ratio of the source gas. The silicon nitride film, in the AM-EWOD device 10 in accordance with the present embodiment, preferably has a thickness of, for example, 50 to 400 nm and more preferably has a thickness of, for example, 100 to 200 nm.

The silicon nitride film contains nitrogen (N) and silicon (Si) and in some cases further contains hydrogen (H). The silicon nitride film has a surface where only a small number of reactive functional groups is exposed as shown in the schematic illustration of (b) of FIG. 1. Therefore, if the water-repelling layer is stacked on the silicon nitride film in this condition with no surface treatment, the reactive functional groups that are exposed on the water-repelling layer remain not bonded with the silicon nitride film, thereby failing to provide sufficient adhesion.

On the other hand, if the surface of the silicon nitride film is doped with oxygen for oxidation, a surface layer region is formed where the oxygen concentration is locally high. As a result, reactive functional groups such as hydroxyl groups (Si—OH) bonded to the silicon on the surface of the silicon nitride film are produced in some parts of the surface.

Next, as a metal-oxide film is formed on the silicon nitride film having an oxidized surface by depositing a metal compound containing metal atoms (M) by PVD, the reactive functional groups such as the Si—OH on the silicon nitride film go through the following reaction to form Si—O-M-OH bonds:

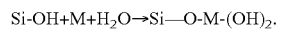

To form the metal-oxide film similarly by CVD, a precursor such as an organic metal compound (MRn) containing metal atoms (M) is deposited, and the reactive functional groups such as the Si—OH on the silicon nitride film similarly go through the following reaction with the precursor to form Si—O-M-OH bonds:

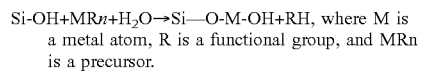
where M is a metal atom, R is a functional group, and MRn is a precursor.

As a water-repelling layer is subsequently stacked on the metal-oxide film containing hydroxyl groups on the surface thereof, the M-OH groups on the metal-oxide film react with the reactive functional groups (e.g., Si—OR groups) on the surface of the water-repelling layer to form M-O—Si bonds, thereby achieving high adhesion.

The surface of the silicon nitride film may be oxidized by any method including $O_2$ plasma treatment, UV treatment, treatment with ozonated water or a like oxidizing liquid, and annealing. In this context, annealing refers to, for example, heat treatment at 100 to 250° C. in the air or in an oxygen atmosphere.

The surface layer region that is formed on the surface of the silicon nitride film and in the vicinity thereof by the oxidation process and that exhibits a locally high oxygen concentration has an oxygen content that may either be constant in the depth direction or have such a concentration gradient as to decrease from the surface on the side that is in contact with the water-repelling layer toward the surface on the side that is in contact with the first electrodes.

To maintain a high permittivity of the silicon nitride film, the surface layer region preferably has a thickness that is less than or equal to 10% the thickness of the dielectric layer and more preferably has a thickness that is less than or equal to 5% the thickness of the dielectric layer. If the surface layer region is doped with oxygen to a significant depth of the silicon nitride film in excess of 10% the thickness of the dielectric layer, the silicon nitride film may have a low permittivity. More specifically, the oxygen concentration is preferably less than or equal to 2 atom % and more preferably less than or equal to 1 atom % at a depth from the surface of the silicon nitride film that is in excess of 10% the thickness of the dielectric layer. The oxygen concentrations on the surface of the silicon nitride film and inside the film and the depth from the surface can be measured by XPS depth profiling where both X-ray photoelectron spectroscopy and noble gas ion sputtering are used to expose the internal structure of the film for successive surface composition analysis.

To uniformly form Si—O-M-OH bonds with the metal-oxide film across the entire surface of the silicon nitride film, the surface layer region has a thickness preferably greater than or equal to 1 nm and more preferably greater than or equal to 2 nm.

To produce a sufficient number of reactive functional groups (Si—OH) to ensure bonding with the metal-oxide film, the surface of the silicon nitride film in contact with the metal-oxide film has an oxygen concentration preferably greater than or equal to 5 atom % and more preferably in the range of 10 to 20 atom %.

The metal-oxide film that provides a surface layer for the dielectric layer may be formed either by physical vapor deposition (PVD) including sputtering and vacuum vapor deposition under heat or an electronic beam or by chemical vapor deposition (CVD) including plasma CVD and atomic layer deposition.

In physical vapor deposition (PVD), the metal-oxide film formed at higher temperature generally exhibits higher levels of fineness, adhesion, and leak resistance. Meanwhile, such a high temperature process adversely can affect the characteristics of the TFTs because the dielectric layer is formed as the uppermost layer of the TFTs. In addition, as mentioned earlier, when an organic material is used in the TFTs in a layer below the dielectric layer, the film-forming temperature has an upper limit to prevent degradation of the organic material. The film-forming conditions (temperature conditions) for the metal-oxide film therefore have limits, which makes it difficult to achieve high levels of fineness and adhesion. It is however possible to achieve higher levels of fineness and adhesion by controlling the components of the metal-oxide film or the surface condition of the coating film.

In chemical vapor deposition (CVD), the metal-oxide film formed at lower film-forming temperature than in physical vapor deposition (PVD) exhibits high levels of adhesion and fineness. Chemical vapor deposition (CVD) is hence preferred in forming the metal-oxide film. In chemical vapor deposition (CVD), atomic layer deposition (which may hereinafter be referred to as "ALD") is particularly preferred because ALD is capable of forming a thin film with even higher levels of adhesion and fineness. High leak resistance hence becomes obtainable. For these reasons, ALD is the most suitable film-forming method for AM-EWOD devices to which high voltage is applied.

The following description will focus on ALD-based film formation, but an appropriate film-forming method including ALD may be selected from the methods described above.

A film may be formed by ALD as described in the following. First, a precursor (first gas) such as an organic metal compound (MRn) containing metal atoms (M) is introduced to an ALD device, to form a monoatomic layer on the substrate surface (silicon nitride film) by chemical adsorption. Next, an inert gas is introduced to remove (purge) the excess precursor from the gas phase. Next, a second gas (e.g., water vapor) is introduced to form a metal oxide by oxidizing the monoatomic layer. Next, an inert gas is introduced to remove the excess second gas from the gas phase, which completes one cycle of ALD where a metal-oxide film is completely formed with a fine and uniform structure. The cycle is repeated until a desired film thickness is obtained, whereby a fine metal-oxide film having a structure that is defined at atomic levels can be formed in a self-alignment manner. Especially, the introduction of water vapor as the second gas enables the surface of the metal-oxide film to have a structure where the bonds are ended uniformly with a hydroxyl (OH) group. By stacking a water-repelling layer on such a metal-oxide film surface, a stack structure is obtained where the silicon nitride film, the metal-oxide film, and the water-repelling layer are firmly and intimately attached by chemical bonding, as shown in the schematic illustration of (a) of FIG. 1.

The formation of the more uniform metal-oxide film between the silicon nitride film and the water-repelling layer by ALD improves the adhesion between the layers and films, thereby allowing for improvement of leak resistance. The formation of the more uniform metal-oxide film can also provide an AM-EWOD device with a high permittivity and consistent droplet actuation capability.

The metal oxides contained in the metal-oxide film may be, for example, oxides and composite oxides of metals such as hafnium, aluminum, titanium, zirconium, and silicon. Hafnium oxide ($HfO_2$) is particularly preferred for its high dielectric constant approximately 3 to 4 times that of silicon nitride. The provision of a hafnium oxide film on the silicon nitride film (underlayer) as the surface layer of the dielectric layer can reduce the thickness of the dielectric layer needed to achieve a desirable capacitance, thereby lowering the actuation voltage for the device, while maintaining a high level of insulation (leak resistance).

The thickness of the metal-oxide film in the AM-EWOD device 10 in accordance with the present embodiment is, for example, preferably from 50 to 200 nm and more preferably from 100 to 200 nm. When the metal-oxide film is a hafnium oxide film, the thickness of the metal-oxide film may be further reduced to 30 to 100 nm.

The first water-repelling layer 17 may be obtained by forming a film of a water-repelling material with a thickness of approximately 30 to 100 nm by a conventional film-forming method such as dip coating, slit coating, or printing and where necessary by additionally patterning the film by photo/dry etching. The patterning for the first water-repelling layer 17 may be done by patterning photoresist by photolithography, then forming a film of a water-repelling material, and removing (lifting off) both the photoresist and the water-repelling layer. The water-repelling material may be a high water-repelling fluorine resin and preferably, as an example, a fluorine resin having on side chains thereof functional groups that can react with the functional groups (M-OH) on the metal-oxide film surface to form M-O—Si bonds. Examples of such functional groups include —Si—OR, —NH—Si—OR, —CO—NH—Si—OR, and —COOH. CYTOP® is a more specific example.

In the AM-EWOD device 10 in accordance with the present embodiment, the second substrate 21 is provided with a second electrode 20 that is, for example, a transparent oxide electrode of, for example, ITO (indium tin oxide), IZO (indium zinc oxide), or ZnO (zinc oxide) or a metal electrode of, for example, titanium (Ti) or aluminum (Al). On the second electrode 20 is there provided a second water-repelling layer 19 that covers the second electrode 20. The second water-repelling layer 19, similarly to the first water-repelling layer, may be obtained by forming a film of a high water-repelling fluorine resin with a thickness of approximately 30 to 100 nm by a conventional film-forming method such as dip coating, slit coating, or printing. The second substrate may have holes (not shown) for injection of the droplet 18 (reagent).

The AM-EWOD device in accordance with the present embodiment achieves excellent adhesion between the water-repelling layer and the dielectric layer since the AM-EWOD device includes the combination of a surface-oxidized silicon nitride film and a metal-oxide film as a dielectric layer. This structure can prevent the water-repelling layer from being detached in the manufacturing process, thereby achieving high-yield manufacturing of the AM-EWOD device.

The stacking of the metal-oxide film on the silicon nitride film can mitigate the adverse effects of defects that can occur in films formed by plasma CVD (e.g., pinholes and cracks).

More specifically, as shown in (b) of FIG. 2 and (b) of FIG. 3, if a defect X (e.g., film deficiency or cracks) develops in a dielectric layer (monolayer) 14V included in a conventional active matrix substrate 30V due to contamination of the dielectric layer 14V by a foreign object or for other reasons, the defect can be a leak source and may lead to a leak flaw.

In contrast, as shown in (a) of FIG. 2 and (a) of FIG. 3, even if a defect develops in the silicon nitride film, the stacking of the metal-oxide film 16 and the silicon nitride film 14 which includes the oxidized surface layer region 15 enables the metal-oxide film 16 to compensate for the defect, thereby preventing leak flaws.

The further provision of the silicon nitride film as an underlayer for the metal-oxide film can prevent degradation of the metal-oxide film that is likely to occur near the end regions of the array electrodes, thereby forming a uniform metal-oxide film.

In other words, as shown in (b) of FIG. 9, if the metal-oxide film is stacked as a dielectric layer directly on the thin-film electronic circuit 12 and the array electrodes 13, crystallinity and other film properties differ between a metal-oxide film 16Va stacked on the array electrodes 13 and a metal-oxide film 16Vb stacked on the thin-film electronic circuit 12. As a result, the dielectric layer comes to exhibit inconsistent properties, which may make it difficult to accurately control the actuation of a droplet. This boundary also tends to be a leak source and may lead to a leak flaw.

In contrast to this, as shown in (a) of FIG. 9, the provision of the silicon nitride film 14 as the underlayer for the metal-oxide film 16 so as to uniformly cover the thin-film electronic circuit 12 and the array electrodes 13 enables the uniform formation of the metal-oxide film 16. This structure can provide an AM-EWOD device with excellent leak resistance and capability of reliably controlling the actuation of a droplet.

Embodiment 2

A description is now given of another embodiment of the present invention with reference to FIGS. 6 and 7.

FIG. 6 is an illustration of a method of manufacturing an active matrix substrate in accordance with the present embodiment. FIG. 7 is an illustration of a method of manufacturing an opposite substrate in accordance with the present embodiment.

First, as shown in (a) of FIG. 6, a buffer layer 101 is formed on a glass substrate (first substrate) 100. The buffer layer 101 may be, for example, a film of $SiN_x$, $SiO_2$, or SiNO with a thickness of approximately 100 to 300 nm. The buffer layer may have either a monolayer structure or a multilayer structure including a stack of two or more films and may also be omitted altogether in some devices. There is formed a semiconductor layer 102 on the buffer layer 101. The semiconductor layer 102 is a Si film with a thickness of approximately 20 to 100 nm and may be photo/dry-etched for patterning after being formed and crystallized. On the buffer layer 101 and the semiconductor layer 102 is there formed, for example, either a film of $SiN_x$ or $SiO_2$ or a stack of $SiN_x/SiO_2$ films with a thickness of approximately 50 to 200 nm as a gate insulating layer 103. Additionally, the Si film may be doped with a n- or p-type impurity. The semiconductor layer 102 may be made of an oxide semiconductor.

Next, as shown in (b) of FIG. 6, gate electrodes 104 are formed. The gate electrodes 104 may be obtained by forming a film of a metal material such as W, Mo, or Al with a thickness of 100 to 400 nm and subsequently patterning the film by photo/dry etching. The gate electrodes 104 may, where appropriate, be either a stack of, for example, W/Ta, MoW, Ti/Al, Ti/Al/Ti, and Al/Ti or made of an alloy of these metals, for the purpose of improving adhesion and contact resistance.

Next, as shown in (c) of FIG. 6, a film of $SiN_x$, $SiO_2$, or SiNO, or a stack of these films is formed with a thickness of approximately 500 to 900 nm as an interlayer insulating layer 105. Thereafter, the interlayer insulating layer 105 and the gate insulating layer 103 are photo/dry-etched to form contact holes 106 on the semiconductor layer 102.

Next, a film of a metal material such as Al or Mo is formed with a thickness of 200 to 400 nm and subsequently photo/dry-etched for patterning, to form source electrodes 107 and drain electrodes 108 shown in (d) of FIG. 6 on the interlayer insulating layer 105 and inside the contact holes 106. The source electrodes 107 and the drain electrodes 108 may, where appropriate, be either a stack of metal materials or made of an alloy, for the purpose of improving adhesion and contact resistance. The metal materials may be any suitable material including Ti/Al, Ti/Al/Ti, Ali, TiN/Al/TiN, Mo/Al, Mo/Al/Mo, Mo/AlNd/Mo, and MoN/Al/MoN.

Next, as shown in (e) of FIG. 6, an interlayer insulating layer 109 is formed on the interlayer insulating layer 105, the source electrodes 107, and the drain electrodes 108. The interlayer insulating layer 109 may be obtained by forming a film of a photosensitive organic material and then patterning the film by photolithography. On the interlayer insulating layer 109 are there formed array electrodes (first electrodes) 110 that are partly in contact with the drain electrodes 108. The array electrodes 110 may be obtained by forming a film of an electrode material such as ITO, IZO, or ZnO with a thickness of approximately 50 to 150 nm on the drain electrodes 108 and the interlayer insulating layer 109 and then patterning the film by photo/wet etching. After being patterned, the array electrodes 110 may be annealed to reduce their resistance.

Next, as shown in (f) of FIG. 6, a dielectric layer 111 is formed on the interlayer insulating layer 109 and the array electrodes 110. The dielectric layer 111 serves to protect the lower layer for the active matrix substrate and to ensure the insulation of a droplet from the active matrix substrate when the EWOD device is used.

Similarly to the previous embodiment, the dielectric layer 111 is obtained by forming a silicon nitride ($SiN_x$) film by plasma CVD, oxidizing the surface of the film to form a surface layer region having a high oxygen concentration, and forming a metal-oxide film on the surface layer region by ALD. The surface of the film may be oxidized by any method that is capable of providing, near the surface of the silicon nitride film, a region having a higher oxygen concentration than the interior of the silicon nitride film. Examples of such a method include $O_2$ plasma treatment, UV treatment, treatment with ozonated water or a like oxidizing liquid, and annealing. Specifics such as the thickness of the silicon nitride film, the thickness of the surface layer region having a high oxygen concentration, the type and thickness of the metal-oxide film, the oxygen concentration in and out of the surface layer region, and the oxygen concentration on the surface of the silicon nitride film are the same as those given in the previous embodiment. The dielectric layer 111 may be patterned by photo/dry etching so that the dielectric layer 11 can be removed from packaging terminal portions of the active matrix substrate (not shown in FIG. 6).

Finally, as shown in (g) of FIG. 6, a first water-repelling layer 112 is formed on the dielectric layer 111. The first water-repelling layer 112 may be obtained by forming a film of a water-repelling material with a thickness of approximately 30 to 100 nm by a film-forming method such as dip coating, slit coating, or printing and then patterning the film by photo/dry etching. This patterning for the first water-repelling layer 112 may be done by a lift-off process where photoresist is patterned by photolithography, a film of a water-repelling material is then formed, and the first water-repelling layer is removed together with the photoresist. The water-repelling material may be a high water-repelling fluorine resin. A preferred example of such a fluorine resin is a fluorine resin having on side chains thereof functional groups that can react with the reactive functional groups (Si—OH) on the silicon nitride film surface to form Si—O—Si bonds. Examples of such functional groups include —Si—OR, —NH—Si—OR, —CO—NH—Si—OR, and —COOH. CYTOP® is a more specific example.

The active matrix substrate is obtained by the steps described above. Note that although FIG. 6 shows a method of manufacturing a TFT circuit in an array element on an active matrix substrate, peripheral circuitry such as a gate driver and a source driver may be formed simultaneously.

A description will be given next of a method of manufacturing an opposite substrate of a microfluidic device in accordance with the present embodiment and a method of manufacturing and a structure of the microfluidic device with reference to (a) to (d) of FIG. 7. A method of manufacturing an opposite substrate will be first described. First, as shown in (a) of FIG. 7, an opposite electrode (second electrode) 201 is formed on a glass substrate (second substrate) 200. The opposite electrode 201 may be obtained by forming a film of an electrode material such as ITO, IZO, or ZnO with a thickness of approximately 50 to 150 nm.

Next, as shown in (b) of FIG. 7, a second water-repelling layer 202 is formed on the opposite electrode 201 and patterned by photo/dry etching. The second water-repelling layer 202 on the opposite substrate may have the same composition and thickness as the first water-repelling layer 112 on the active matrix substrate and may be formed by the same film-forming method and the same patterning method as the first water-repelling layer 112 on the active matrix substrate.

Finally, as shown in (c) of FIG. 7, a reagent injection port 203 is formed through the glass substrate 200, the opposite electrode 201, and the second water-repelling layer 202. The reagent injection port 203 is an opening for injecting a reagent and oil that are actually controlled when the microfluidic device is used and simultaneously removing gas from the space filled with the reagent and oil. The reagent injection port 203 may be formed by drilling or like mechanical processing or by glass fabrication technology such as wet etching or laser processing. The reagent injection port 203 has a diameter of approximately 1 to 5 mm and may have a diameter selected in a suitable manner in accordance with the method of injecting the reagent and oil and the amount of the reagent and oil to be injected.

The opposite substrate is obtained by the steps described above. Note that although (c) of FIG. 7 shows an example that has one reagent injection port 203, there may be provided a plurality of reagent injection ports 203.

A description will be given next of a method of manufacturing the microfluidic device shown in (d) of FIG. 7.

First, a pattern of a sealing member 204 is provided, using a dispenser, on those parts of the dielectric layer 111 that are exposed by removing parts of the first water-repelling layer 112 by patterning on the active matrix substrate shown in (g) of FIG. 6. The sealing member 204 is provided along the entire peripheries of the cells into which the opposite substrate is divided in a later step.

Then, on the opposite substrate shown in (c) of FIG. 7, the opposite electrode 201 from which the second water-repelling layer 202 has been removed by patterning is aligned with the sealing member 204. The opposite electrode 201 and the sealing member 204 are then attached together. The water-repelling layer on the active matrix substrate and the water-repelling layer on the opposite substrate are therefore placed opposite each other.

When attaching the opposite electrode 201 and the sealing member 204, plastic, glass, or like beads are put in the sealing member 204 to ensure that the active matrix substrate and the opposite substrate are separated by a cell gap. Taking it into account that a predetermined amount of reagent needs to be injected into the cell and actuated, the beads put in the sealing member 204 may have a diameter of 200 to 300 µm.

After the attaching, both substrates are annealed under a certain force, to cure the sealing member 204. This process enables attachment of the active matrix substrate and the opposite substrate while ensuring a uniform cell gap. Since the sealing member 204 is provided along the entire peripheries of the cells, the sealing member 204 seals each cell separately between the active matrix substrate and the opposite substrate. Electrically conducting paste for vertical electrical conduction may be applied to the opposite substrate simultaneously with the provision of the above-described sealing member 204, to connect the opposite electrode to packaging terminals.

The active matrix substrate and the microfluidic device including the active matrix substrate both in accordance with the present embodiment exhibit excellent adhesion between the water-repelling layer and the dielectric layer because the substrates include a surface-oxidized silicon nitride film and a metal-oxide film as a dielectric layer. This structure can prevent the water-repelling layer from being undesirably lifted off in the manufacturing process, thereby enabling high-yield manufacturing of the active matrix substrate and the microfluidic device. Additionally, leak flaws can be prevented because the metal-oxide film covers up the defects that the silicon nitride film may have. Furthermore, the provision of a metal-oxide film, in particular a hafnium oxide film, allows for reduction of the thickness of the dielectric layer needed to achieve a desirable capacitance, thereby further lowering the actuation voltage for the device, while maintaining a high level of insulation. Meanwhile, when the conventional level of actuation voltage is used, the thickness of the dielectric layer needed to achieve a desirable capacitance may be increased, which can in turn further improve leak resistance.

Embodiment 3

A description is now given of another embodiment of the present invention.

The present embodiment differs from Embodiment 2 in that in the former, the metal-oxide film in the dielectric layer is formed by DC sputtering. The following will describe another embodiment of the present invention.

Similarly to the previous embodiment, a dielectric layer 111 is obtained by forming a silicon nitride (SiN$_x$) film by plasma CVD, oxidizing the surface of the film to form a surface layer region having a high oxygen concentration, and forming a metal-oxide film on the surface layer region by DC sputtering. More specifically, a metal-oxide film is formed with a thickness of approximately 30 to 100 nm by using a sintered metal oxide as a target material, introducing argon and gaseous oxygen into a film-forming chamber, and heating the substrate to a temperature of 200° C. The metal-oxide film is formed at a rate of 10 nm/scan. A particularly preferred metal-oxide material is hafnium oxide (HfO$_2$). Following the formation of the metal-oxide film, annealing may be done in the air or in an oxygen atmosphere to compensate for the oxygen deficiency of the film and improve the film quality.

The AM-EWOD device in accordance with the present embodiment exhibits excellent adhesion between the water-repelling layer and the dielectric layer because the AM-EWOD device includes a surface-oxidized silicon nitride film and a metal-oxide film as a dielectric layer. This structure can prevent the water-repelling layer from being undesirably lifted off in the manufacturing process, thereby enabling high-yield manufacturing of the AM-EWOD device. Furthermore, the provision of a metal-oxide film, in particular a hafnium oxide film, allows for reduction of the thickness of the dielectric layer needed to achieve a desirable capacitance, thereby further lowering the actuation voltage for the device, while maintaining a high level of insulation. Meanwhile, when the conventional level of actuation voltage is used, the thickness of the dielectric layer needed to achieve a desirable capacitance may be increased, which can in turn further improve leak resistance.

Embodiment 4

A description is now given of another embodiment of the present invention with reference to FIG. 8.

FIG. 8 is a cross-sectional view of an AM-EWOD device 1000 in accordance with the present embodiment.

The present embodiment differs from Embodiment 1 in that in the former, the dielectric layer is a stack of three layers. The dielectric layer may alternatively have a multi-layer structure including a stack of four or more layers. A first substrate 1001, a thin-film electronic circuit 1002, array electrodes (first electrodes) 1003, a metal-oxide film 1007, a first water-repelling layer 1008, a droplet 1009, a second water-repelling layer 1010, a second electrode 1011, and a second substrate 1012 have the same structure as their counterparts described in Embodiment 1 above. The present embodiment differs from Embodiment 1 in that in the former, the dielectric layer is a stack of three layers.

Referring to FIG. 8, the AM-EWOD device 1000 in accordance with the present embodiment includes an active matrix substrate 1100 including the first substrate 1001, an opposite substrate 1200 including the second substrate 1012, and at least one droplet 1009 enclosed in a gap between the active matrix substrate 1100 and the opposite substrate 1200.

In the active matrix substrate 1100, the thin-film electronic circuit 1002 is disposed on the first substrate 1001, and the actuatable array electrodes (first electrodes) 1003 are disposed on the thin-film electronic circuit 1002.

Referring to FIG. 8, the AM-EWOD device 1000 in accordance with the present embodiment includes, as a lower underlayer 1004 covering the thin-film electronic circuit 1002 and the array electrodes (first electrodes) 1003 both on the first substrate 1001, a silicon nitride film (SiN$_x$), a silicon oxynitride film (SiNO), or a silicon oxide film (SiO) on the thin-film electronic circuit 1002 and the array electrodes (first electrodes) 1003. The lower underlayer is preferably a silicon nitride film to maintain a high permittivity. Next, an upper underlayer 1005 is disposed on the lower underlayer 1004. The upper underlayer 1005 is a silicon nitride film formed by plasma CVD. In the device, the upper underlayer 1005 has, on a side thereof that is in contact with the water-repelling layer, a surface that is oxidized and that thereby provides a surface layer region 1006 where the silicon nitride film is doped with oxygen (O) in the surface and its vicinity. The metal-oxide film 1007 is disposed on this oxygen-containing surface layer region 1006.

Both the silicon nitride film in the upper underlayer 1005 and the metal-oxide film 1007 serve to ensure insulation between the droplet and the active matrix substrate when the EWOD device is used. Meanwhile, the lower underlayer 1004 serves to protect the lower layer (thin-film electronic circuit 1002 and array electrodes 1003) of the active matrix substrate, as well as to ensure insulation.

The silicon nitride film, the silicon oxynitride film, and the silicon oxide film in the underlayers 1004 and 1005 are suitably formed by plasma CVD using a source gas containing, for example, a nitrogen-containing gas (e.g., gaseous N$_2$ or gaseous NH$_3$) and/or gaseous oxygen and gaseous SiH$_4$. For instance, the underlayers 1004 and 1005 can be consecutively formed by forming the lower underlayer 1004 by plasma CVD and then forming the upper underlayer 1005 using a different type of source gas and/or by a different flow rate ratio of the source gas.

When the lower underlayer 1004 and the upper underlayer 1005 are both silicon nitride films, the lower underlayer 1004 and the upper underlayer 1005 preferably have different compositions (ratios of Si, N, and H), different densities, or different hydrogen contents. In addition, the silicon nitride film in the upper underlayer 1005 more preferably has a lower hydrogen content than the silicon nitride film in the lower underlayer 1004. Furthermore, the silicon nitride film in the upper underlayer 1005 more preferably has a higher density than the silicon nitride film in the lower underlayer 1004.

The different compositions or densities of the lower underlayer 1004 and the upper underlayer 1005 can mitigate the adverse effects of defects that can occur in films formed by plasma CVD (e.g., pinholes and cracks). In other words, defects would occur in different locations in the lower dielectric layer and the upper dielectric layer. The microfluidic device, in which the lower dielectric layer overlaps the upper dielectric layer, is even less likely to develop leak flaws.

In the AM-EWOD device in accordance with the present embodiment, the underlayer has a thickness, that is, the sum of the thickness of the lower underlayer and the thickness of the upper underlayer, of, for example, 100 to 200 nm.

When the lower underlayer 1004 is a silicon nitride film, the thicknesses of the lower underlayer 1004 and the upper underlayer 1005 may have any ratio. Meanwhile, when the lower underlayer 1004 is a silicon oxynitride film or a silicon oxide film, the thicknesses of the lower underlayer and the upper underlayer preferably have such a ratio as to maintain a high permittivity. Specifically, the upper underlayer 1005, which includes a silicon nitride film, preferably has a thickness greater than or equal to 50% that of the entire underlayer and more preferably has a thickness 70 to 90% that of the entire underlayer.

The silicon nitride film in the upper underlayer 1005 may be oxidized by the same method as its counterpart described in Embodiment 1 above, and the resultant surface layer region 1006 may have the same thickness and oxygen concentration as its counterpart described in Embodiment 1.

The AM-EWOD device in accordance with the present embodiment exhibits excellent adhesion between the water-repelling layer and the dielectric layer because the AM-EWOD device includes a surface-oxidized silicon nitride film and a metal-oxide film as the dielectric layer. This structure can prevent the water-repelling layer from being undesirably lifted off in the manufacturing process, thereby enabling high-yield manufacturing of the AM-EWOD device. Additionally, the three-layered structure of the dielectric layer mitigates the adverse effects of film defects, thereby more reliably preventing leak flaws. Furthermore, the provision of a metal-oxide film, in particular a hafnium oxide film, allows for reduction of the thickness of the dielectric layer needed to achieve a desirable capacitance, thereby further lowering the actuation voltage for the device, while maintaining a high level of insulation. Meanwhile, when the conventional level of actuation voltage is used, the thickness of the dielectric layer needed to achieve a desirable capacitance may be increased, which can in turn further improve leak resistance.

General Description

The active matrix substrate 30 of aspect 1 of the present invention includes: the first substrate 11; and first electrodes (array electrodes 13), a dielectric layer covering the first electrodes (array electrodes 13), and the first water-repelling layer 17 in this sequence on the first substrate 11, wherein the dielectric layer has a multilayer structure including two or more layers and includes the silicon nitride film 14 and the metal-oxide film 16 between the silicon nitride film and the first water-repelling layer, and the silicon nitride film has the oxygen-containing surface layer region 15 on a surface thereof that is in contact with the metal-oxide film.

This structure allows for a reduced actuation voltage and exhibits excellent adhesion between the dielectric layer and the water-repelling layer.

In aspect 2 of the present invention, the active matrix substrate of aspect 1 may be preferably configured such that the metal-oxide film is a hafnium oxide film.

This structure allows for a further reduced actuation voltage and further improves leak resistance.

In aspect 3 of the present invention, the active matrix substrate of aspect 1 or 2 may be preferably configured such that the first water-repelling layer contains a fluorine resin that has functional groups for adhesion to the metal-oxide film.

This structure provides a water-repelling layer that exhibits excellent water-repelling properties and excellent adhesion to the metal-oxide film.

The microfluidic device 10 of aspect 4 of the present invention includes: the active matrix substrate of any of aspects 1 to 3; and the opposite substrate 40 including: the second substrate 21; and the second electrode 20 and the second water-repelling layer 19 in this sequence on the second substrate 21, wherein the active matrix substrate and the opposite substrate are attached together via a sealing member with a gap intervening therebetween in such a manner that the first water-repelling layer and the second water-repelling layer are located opposite each other.

This structure provides a microfluidic device that allows for a reduced actuation voltage and exhibits excellent adhesion between the dielectric layer and the water-repelling layer.

A method of manufacturing an active matrix substrate of aspect 5 of the present invention includes: forming first electrodes on a first substrate; forming a dielectric layer covering the first electrodes; and forming a first water-repelling layer on the dielectric layer, wherein the forming of the dielectric layer includes: forming a silicon nitride film by plasma chemical vapor deposition; oxidizing a surface of the silicon nitride film; and forming a metal-oxide film by atomic layer deposition, and the forming of the first water-repelling layer includes forming the first water-repelling layer on a surface of the metal-oxide film.

This structure achieves the same advantages as aspect 1.

A method of manufacturing a microfluidic device of aspect 6 of the present invention includes: the method of aspect 5; forming an opposite substrate, the forming of the opposite substrate including forming a second electrode on a second substrate and forming a second water-repelling layer on the second electrode; and attaching the active matrix substrate and the opposite substrate together via a sealing member with a gap intervening therebetween in such a manner that the first water-repelling layer and the second water-repelling layer are located opposite each other.

This structure achieves the same advantages as aspect 4.

The present invention is not limited to the description of the embodiments above and may be altered within the scope of the claims. Embodiments based on a proper combination of technical means disclosed in different embodiments are encompassed in the technical scope of the present invention. Furthermore, a new technological feature can be created by combining different technological means disclosed in the embodiments.

What is claimed is:

1. A method of manufacturing an active matrix substrate, the method comprising:
    forming first electrodes on a first substrate;
    forming a dielectric layer covering the first electrodes; and
    forming a first water-repelling layer on the dielectric layer, wherein
    the forming of the dielectric layer comprises:
        forming a silicon nitride film by plasma chemical vapor deposition;
        oxidizing a surface of the silicon nitride film; and
        forming a metal-oxide film by atomic layer deposition, and
    the forming of the first water-repelling layer comprises
        forming the first water-repelling layer on a surface of the metal-oxide film.

2. A method of manufacturing a microfluidic device, the method comprising:
    the method according to claim 1;
    forming an opposite substrate, the forming of the opposite substrate comprising forming a second electrode on a second substrate and forming a second water-repelling layer on the second electrode; and
    attaching the active matrix substrate and the opposite substrate together via a sealing member with a gap intervening therebetween in such a manner that the first water-repelling layer and the second water-repelling layer are located opposite each other.

* * * * *